United States Patent [19]

Brazdrum et al.

[11] Patent Number: 4,999,634
[45] Date of Patent: Mar. 12, 1991

[54] INTEGRATABLE SWITCHED-CAPACITOR SIGMA-DELTA MODULATOR

[75] Inventors: Helmut Brazdrum, München; Rudolf Koch, Unterhaching, both of Fed. Rep. of Germany

[73] Assignee: Siemens Aktiengesellschaft, Munich, Fed. Rep. of Germany

[21] Appl. No.: 520,250

[22] Filed: May 7, 1990

[30] Foreign Application Priority Data

May 8, 1989 [EP] European Pat. Off. ............ 89108255

[51] Int. Cl.$^5$ ............................................ H03M 1/12
[52] U.S. Cl. ...................................... 341/172; 341/143
[58] Field of Search ................. 341/143, 172, 131, 108

[56] References Cited

U.S. PATENT DOCUMENTS

| | | |
|---|---|---|
| 3,251,052 | 5/1966 | Hoffman et al. |
| 3,462,754 | 8/1969 | Hoffman .................. 341/172 |
| 3,585,634 | 6/1968 | Sharples .................. 341/172 |
| 3,906,488 | 9/1975 | Suarez-Gartner ................. 341/108 |
| 4,588,981 | 5/1986 | Senn ....................... 341/143 |

FOREIGN PATENT DOCUMENTS

| | | |
|---|---|---|
| 00843353 | 7/1983 | European Pat. Off. |
| 0104988 | 4/1984 | European Pat. Off. |
| 2316660 | 10/1973 | Fed. Rep. of Germany ...... 341/172 |
| 0215904 | 11/1984 | Fed. Rep. of Germany ...... 341/172 |
| 0157223 | 9/1983 | Japan .................. 341/172 |

OTHER PUBLICATIONS

Patent Abstracts of Japan, vol. 9, No. 150 (E-324) (1873), Jun. 25, 1985; & JP-A-60 31 315 (Nippon Denki K. K.), Feb. 18, 1985.
1986 IEEE International Solid-State Circuits Conference, Feb. 20, 1986, Session XIV, pp. 182-183, IEEE, N.Y., US; T. Hayashi et al.: "A Multistage Delta-Sigma Modulator Without Double Integration Loop".
Proceedings of the IEEE 1988 Custom Integrated Circuits Conference, Rochester, N.Y., May 16-19, 1988, pp. 21.3.1-21.3.4, IEEE, N.Y., US; S. R. Norsworthy et al.: "A 13-Bit, 160 kHz Sigma-Delta A/D Converter for ISDN".
Electronic Letters, Feb. 17, 1983, vol. 19, No. 4, pp. 149-150; G. Lainey et al.: "Switched-Capacitor Second-Order Noise-Shaping Coder".

*Primary Examiner*—William M. Shoop, Jr.
*Assistant Examiner*—Nancy Le
*Attorney, Agent, or Firm*—Herbert L. Lerner; Laurence A. Greenberg

[57] ABSTRACT

A switched-capacitor sigma-delta modulator includes at least one memory element, at least one comparator, and at least one integrator. The at least one integrator has an input stage including a series circuit of a first switch, a first capacitor and a second switch, a third switch for connecting one of the two terminals of the first capacitor to ground potential, and a fourth switch for connecting the other of the two terminals of the first capacitor to ground potential. A nodal point is connected between the second and fourth switches and the other of the two terminals of the first capacitor. A negative feedback stage includes second and third capacitors each having one terminal connected to the nodal point. A fifth switch connects the other terminal of the second capacitor to a first potential. A sixth switch connects the other terminal of the third capacitor to a second potential. Seventh and eighth series-connected switches connect the other terminal of the second capacitor to the second potential. Ninth and tenth series-connected switches connect the other terminal of the third capacitor to the first potential. The eighth and tenth switches may be omitted. Eleventh and twelfth switches or thirteenth and fourteenth switches may respectively connect the second and third capacitors to one nodal point or to a nodal point symmetrical thereto or visa versa, as a function of the output signal of the memory element.

4 Claims, 2 Drawing Sheets

INTEGRATABLE SWITCHED-CAPACITOR SIGMA-DELTA MODULATOR

The invention relates to an integratable switched-capacitor sigma-delta modulator having at least one memory element, at least one comparator, at least one integrator having an input stage, and a first switch, a first capacitor and a second switch connected in series, the two terminals of the first capacitor each being able to be acted upon by ground potential through respective third and fourth switches.

At present, high-resolution, highly linear analog/digital converters with a resistor, transistor or capacitor network are achievable only with some form of calibration or correction. For some applications, analog/digital converters with oversampling and noise filtering represent a practicable solution. Work is performed with a high sampling frequency rather than high resolution, and in a following digital, i.e., uncritical filter, a low-frequency, high-resolution signal is obtained from the high-frequency signal with low resolution.

An analog/digital converter of that kind is provided, for instance, by means of a second order sigma-delta modulator followed by a filter. A simplified description of such a converter type can be made if a comparator (that is, a one-bit analog/digital converter) is considered as a linear element with a transmission function of $H=1$, and an additional uncorrelated quantification noise N is introduced as a disturbance variable. For the output signal of the converter, the result is that the input signal is transmitted linearly, and the noise undergoes high-pass filtering. A typical second order sigma-delta modulator has two integrators (therefore the second order), for example, as well as two digital/analog converters and one comparator. The first integrator is acted upon by the sum of the input signal of the sigma delta modulator and the output signal of the first digital/analog converter, while the sum of the output signal of the first integrator and the output signal of the second digital/analog converter is applied to the input of the second integrator. The output signal of the second integrator is delivered to the comparator. The output of the comparator triggers the two digital/analog converters directly or through memory elements.

However, the insensitivity to parameter fluctuations can be even further increased if the sigma-delta modulator is made by switched-capacitor technology instead of with RC elements, for determining the time constants, for example the integrator time constants. In such a case, the time constants are no longer determined by the absolute magnitude of a resistor R and a capacitor C, but by the ratio of two capacitors, which is subject to substantially less fluctuation. The construction of a switched-capacitor sigma-delta modulator is known, for instance, from the publication by G. Lainey et al, entitled "Switched-Capacitor Second Order Noise Shaping Coder", in Electronics Letters, February 1983, Vol. 19, No. 4, pp. 149-150.

In that case, which will be discussed in more detail below in the description of the drawings, the execution time of the sigma-delta modulator is limited by the estimation time of the comparator.

It is accordingly an object of the invention to provide an integratable switched-capacitor sigma-delta modulator, which overcomes the hereinafore-mentioned disadvantages of the heretofore-known devices of this general type and in which less stringent demands must be made of the comparator or switches.

With the foregoing and other objects in view there is provided, in accordance with the invention, a switched-capacitor sigma-delta modulator, comprising at least one memory element; at least one comparator connected to the at least one memory element; at least one integrator being connected to the at least one comparator; the at least one integrator having an input stage including a series circuit of a first switch, a first capacitor having two terminals and second switch, a third switch for connecting one of the two terminals of the first capacitor to ground potential, and a fourth switch for connecting the other of the two terminals of the first capacitor to ground potential; a nodal point connected between the second and fourth switches and the other of the two terminals of the first capacitor; a negative feedback stage including second and third capacitors each having one terminal connected to the nodal point and each having another terminal, a fifth switch for connecting the other terminal of the second capacitor to a first potential, a sixth switch for connecting the other terminal of the third capacitor to a second potential, seventh and eighth series-connected switches for connecting the other terminal of the second capacitor to the second potential, and ninth and tenth series-connected switches for connecting the other terminal of the third capacitor to the first potential.

In accordance with another feature of the invention, the first and second switches have switching phases opposed to the third and fourth switches, the fifth and sixth switches are triggered in phase, the seventh and ninth switches are switched in phase opposition to the first switch, and the eighth and tenth switches are triggered by the output signal of the memory element.

With the objects of the invention in view, there is also provided a switched-capacitor sigma-delta modulator, comprising at least one memory element supplying an output signal; at least one comparator connected to the at least one memory element; at least one integrator having differential inputs, being symmetrically wired and being connected to the at least one comparator; the at least one integrator having two input stages each including a series circuit of a first switch, a first capacitor with two terminals and a second switch, a third switch for connecting one of the two terminals of the first capacitor to ground potential, and a fourth switch for connecting the other of the two terminals of the first capacitor to ground potential; a first nodal point connected between the second and fourth switches and the other of the two terminals of the first capacitor of the first input stage, a second nodal point symmetrical to the first nodal point being connected between the second and fourth switches and the other of the two terminals of the first capacitor of the second input stage; a first negative feedback stage having a second capacitor with two terminals, a second negative feedback stage having a third capacitor with two terminals; a fifth switch for connecting one terminal of the second capacitor to the first nodal point, a sixth switch for connecting the one terminal of the second capacitor to the second nodal point, a seventh switch for connecting one terminal of the third capacitor to the first nodal point, an eighth switch for connecting the one terminal of the third capacitor to the second nodal point, each of the fifth, sixth, seventh and eighth switches operating as a function of the output signal of the memory element, a ninth switch for connecting the other terminal of the second capacitor to a first potential, a tenth switch for connecting the other terminal of the third capacitor to a second potential, an eleventh switch for connecting the other terminal of the second capacitor to the second potential, and a twelfth switch for connecting the other terminal of the third capacitor to the first potential.

In accordance with a concomitant feature of the invention, the first and second switches have switching phases opposed to the third and fourth switches, the ninth and tenth switches are triggered in phase, the eleventh and twelfth switches are switched in phase opposition to the first switch, and the fifth, sixth, seventh and eighth switches are triggered by the output signal of the memory element.

It is an advantage of the invention that at a constant sampling rate, the requirements of the comparator can be reduced considerably, or with the same comparator the sampling rate can be increased, which increases the signal-to-noise ratio.

Other features which are considered as characteristic for the invention are set forth in the appended claims.

Although the invention is illustrated and described herein as embodied in an integratable switched-capacitor sigma-delta modulator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
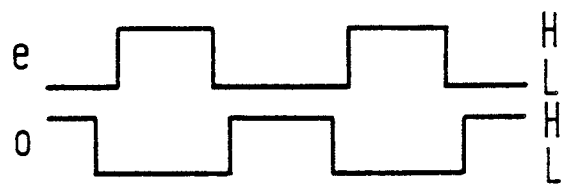
FIG. 1 is a graph of the course of the switching phases in a switched-capacitor sigma-delta modulator.

Referring now to the figures of the drawing in detail and first, particularly, to FIG. 1 thereof, there is seen a graph of the chronological relationship of two phases in a circuit wherein a first integrator which, for instance, is disposed in an outer loop, is constructed as an inverting, delay-free integrator, and a second integrator, which is disposed in an inner loop, is constructed as a non-inverting delaying integrator. The triggering of the switches provided for switching the various elements is performed in two phases, namely a phase e and a phase o. At first, the phase e is at a high level H and the phase o is at a low level L. After a signal change of the phase e, a signal change of phase o from the low level L to the high level H takes place, after a brief delay. The phase o then carries the signal H for a predetermined time.

After the signal transition of the phase o from H to L, a signal change from L to H in the phase e takes place, after a brief delay. Once again, the phase e then carries the signal H for a predetermined time, until a change again takes place, and so forth. While the phase e carries the signal H, a voltage applied to a first capacitor is integrated upward, as a function of the preceding comparator decision. The comparator then decides, through the integration by the second integrator during the signal H of the ensuing phase o, and holds that value. A second capacitor is thereupon charged as a function of that comparator decision. The second integrator is not in operation during that process. If the phase o then carries the signal H, the second integrator integrates the voltage present at the second capacitor as a function of the comparator decision during the signal H of the preceding phase e. The comparator is then reset, and the value is stored in memory in a flip-flop. The first capacitor is then charged again, as a function of the comparator decision in the period of time during which the phase e carries the signal H. At the same time, a capacitor which is acted upon by the input signal is discharged. During that process, the first integrator is not in operation.

It is therefore seen that the comparator must estimate the integration of the second integrator each time there is a signal H of the phase e, and must charge the second capacitor as a function of that estimation, so that upon the signal H of the ensuing phase o, integration will be performed with the correct voltage across the second capacitor. From such conditions, the following requirements can be derived:

A comparator with a very short estimation time is needed. However, that is particularly critical if the input voltage difference becomes close to zero, because the estimation time increases markedly at that time.

The switches connected to the second capacitor must be constructed larger than those around the first capacitor, since at equal capacitances, less time is available for charging the second capacitor.

Accordingly, the execution time of the sigma-delta modulator is limited by the estimation time of the comparator.

Figure 2:
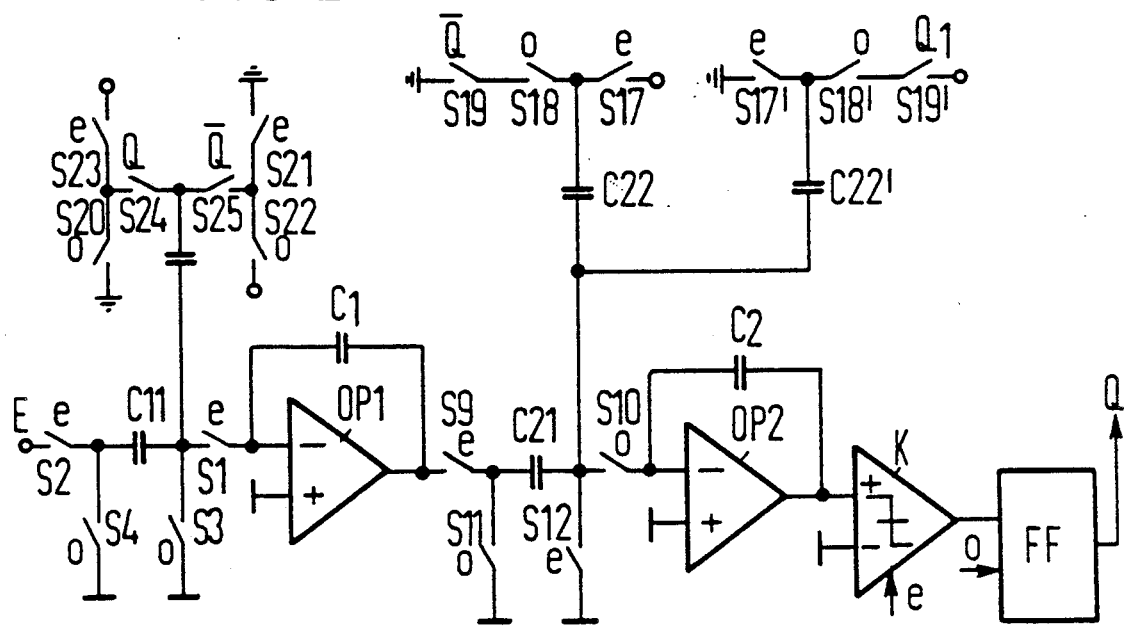
FIG. 2 is a schematic and block circuit diagram of a first embodiment of a switched-capacitor sigma-delta modulator according to the invention.

In the exemplary embodiment shown in FIG. 2 of the drawing, first and second operational amplifiers OP1 and OP2 are provided. A capacitor C1 is connected between the output and the inverting input of the first operational amplifier OP1. The non-inverting input of the first operational amplifier OP1 is a ground potential, which is designated by reference symbol M, as shown in the legend. The inverting input is connected to an input E through a switch S1, a capacitor C11 and a switch S2. Moreover, the terminal of the capacitor C11 oriented toward the input E can be disconnected from ground potential M by a switch S4, and the terminal thereof oriented away from the input E can be disconnected from ground potential M by a switch S3. A nodal point formed by the capacitor C11 and the switch S1 is also connected to one terminal of a capacitor C12, the other terminal of which is acted upon by two switches S24 and S25. The switch S24 in turn is followed by a switch S23 leading to a potential V1 and a switch S20 leading to a potential V2, as shown by the legend. The switch S25 is likewise followed by a switch S22 leading to the potential V1 and a switch S21 leading to the potential V2.

The output of the second operational amplifier OP2 is coupled with the inverting input thereof through a capacitor C2. The output of the first operational amplifier OP1 is connected through a switch S9, a capacitor C21 and a switch S10 with the inverting input of the second operational amplifier OP2. Moreover, the terminal of the capacitor C21 oriented toward the first operational amplifier OP1 can be switched to ground potential M through a switch S11, and the terminal thereof oriented toward the second operational amplifier OP2 can be switched to ground potential M through a switch S12. One terminal of each of two capacitors C22 and C22' is connected to a nodal point formed by the capacitor C21, the switch S12 and the switch S10. Firstly, the other terminal of the capacitor C22 can be connected to the potential V1 through a switch S17 and the other terminal of the capacitor C22' can be connected to the potential V2 through a switch S17'. Secondly, the other terminal of the capacitor C22 can be connected to the potential V2 through a switch S18 or S19 and the other terminal of the capacitor C22' can be connected to the potential V1 through a switch S18' or S19'. The output of the second operational amplifier OP2 is carried to the non-inverting input of a comparator K. The inverting input of the comparator K as well as the non-inverting input of the operational amplifier OP2, are at ground potential M. A flip-flop FF is also connected to the comparator K as a memory element, having an output at which a signal Q appears.

The triggering of the switches and the clocking of the comparator K and of the flip-flop FF are effected as a function of the two switch phases e and o of FIG. 1. The switches S1, S2, S21, S17, S17', S9, S12 and S23, along with the comparator K, are controlled by the switch phase e, and the switches S4, S3, S20, S22, S11, S10, S18, S18', and the flip-flop FF are controlled by the phase o. Moreover, the control of the switches S24 and S19' is effected by the signal Q, and that of the switches S19, S25 is effected by an inverted signal Q. The first, second, third and fourth switches S9, S10, S11, S12 and the first capacitor C21 form the input stage of the integrator OP2. The fifth switch S17 connects the second capacitor C22 to the first potential V1 and the sixth switch S17' connects the third capacitor C22' to the second potential V2. The series-connected seventh and eighth switches S18, S19 connect the second capacitor C22 to the second potential V2, while the ninth and tenth switches S18', S19' connect the third capacitor C22' to the first potential V1.

Figure 3:
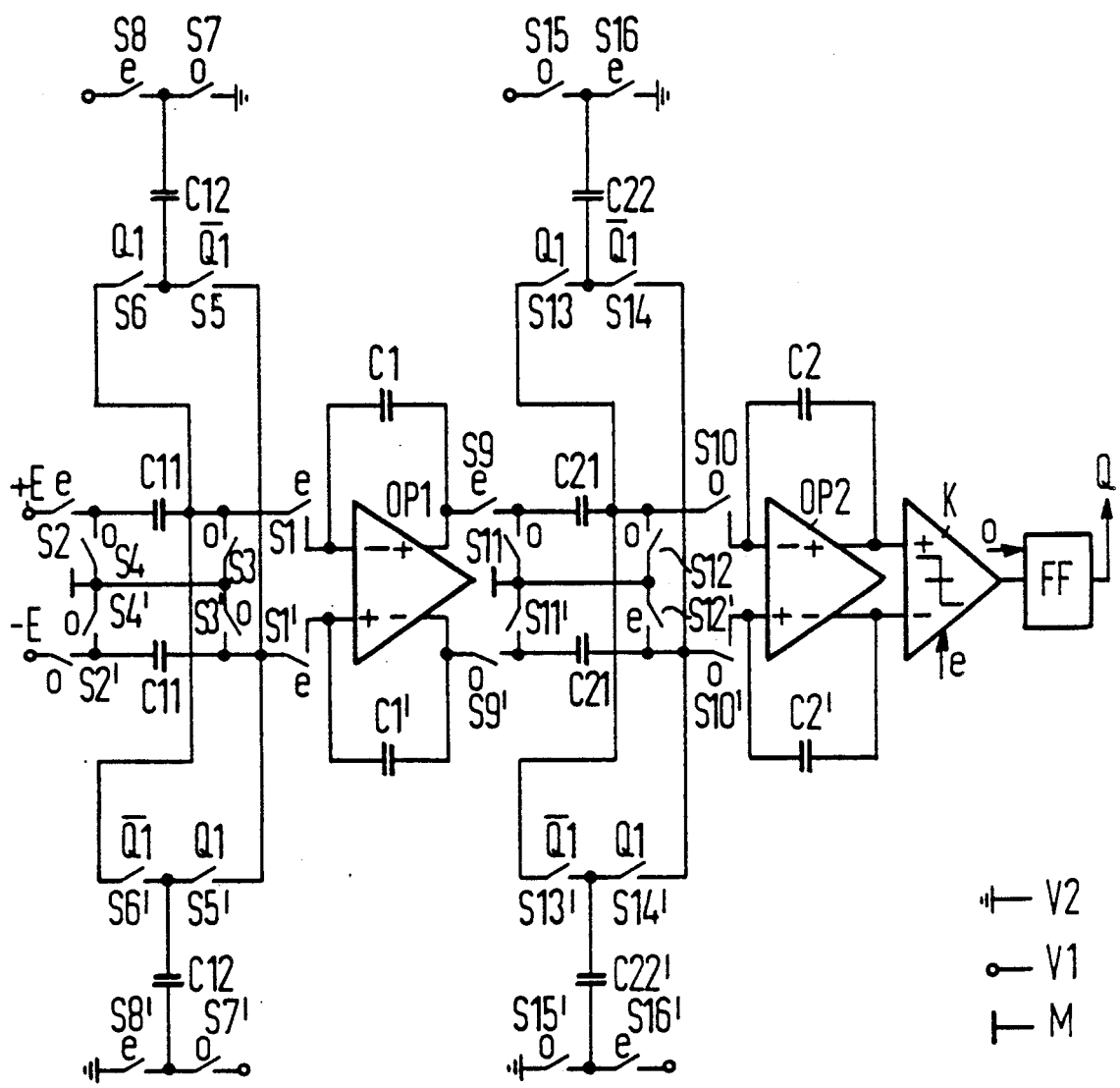
FIG. 3 is a view similar to FIG. 1 of a second embodiment of a switched-capacitor sigma-delta modulator according to the invention.

The two operational amplifiers OP1, OP2 are also provided in the second exemplary embodiment shown in FIG. 3 of the drawing, wherein elements similar to those of FIG. 2 have the same reference symbols. The capacitor C1 is connected between the non-inverting output and the inverting input, and a capacitor C1' is connected between the inverting output and the non-inverting input, of the first operational amplifier OP1. The inverting input of the first operational amplifier OP1 is also connected through the switch S1, the capacitor C11 and the switch S2, with an input +E, and the non-inverting input of the first operational amplifier OP1 is connected through a switch S1', a capacitor C11' and a switch S2', with an input −E. Moreover, the terminal of the capacitor C11 oriented toward the input +E can be connected to ground potential M through the switch S4, and the terminal thereof oriented away from the input +E can be connected to ground potential M through the switch S3. The terminal of the capacitor C11' oriented toward the input −E can be connected to ground potential M through a switch S4', and the terminal thereof oriented away from the input −E can be connected to ground potential M through a switch S3'.

The nodal point formed by the capacitor C11, the switch S3 and the switch S1 is firstly connected to one terminal of the capacitor C12 through a switch S6, and secondly to one terminal of a capacitor C12' through a switch S6'. Similarly, a nodal point formed by the capacitor C11', the switch S3' and the switch S1' is connected through a switch S5 to the one terminal of the capacitor C12 and through a switch S5' to the one terminal of the capacitor C12'. The other terminals of the capacitors C12, C12' can firstly be connected first to the potential V1 through respective switches S8, S7' and secondly to the potential V2 through respective switches S7, S8'.

The capacitor C2 is connected between the non-inverting output and the inverting input, and a capacitor C2' is connected between the inverting output and the non-inverting input, of the second operational amplifier OP2. The non-inverting output of the first operational amplifier OP1 is connected through the switch S9, the capacitor C21 and the switch S10 to the inverting input of the second operational amplifier OP2. In the same manner, the inverting output of the first operational amplifier OP1 is connected to the non-inverting input of the second operational amplifier OP2 through a switch S9', a capacitor C21' and a switch S10'. Moreover, the terminals of the two capacitors C21 and C21' which are oriented toward the first operational amplifier OP1 can be connected to ground potential M through respective switches S11 and S11', and the terminals thereof oriented toward the second operational amplifier OP2 can each be connected to ground potential M through a respective switch S12 and S12'. The capacitor C22 is connected through a switch S13 and the capacitor C22' is connected through a switch S13', to the nodal point formed by the capacitor C21, the switch S12 and the switch S10.

A nodal point formed by the capacitor C21', the switch S12' and the switch S10' is likewise connected through a switch S14 to one terminal of the capacitor C22 and through a switch S14' to one terminal of the capacitor C22'. The other terminals of the capacitors C22 and C22' can be connected to the potential V1 through respective switches S15, S16', and to the potential V2 through respective switches S16 and S15'.

The non-inverting output of the second operational amplifier OP2 is coupled to the non-inverting input of the comparator K, and the inverting output of the operational amplifier OP2 is coupled to the inverting input of the comparator K. The output of the comparator K is carried to the input of the flip-flop FF provided as a memory element, and the output signal Q is present at the output of the flip-flop FF.

The switching cycles of the switches S1, S1' through S16, S16' and of the flip-flop FF are oriented to the fundamental switching behavior of the phases e and o. The chronological relationship of the two phases is shown in FIG. 1 of the drawing. According to that diagram, the generation of signals of the phase e and phase o takes place continuously. The individual switches are each then triggered each by different signals derived therefrom. The switches S1, S1', S2, S2', S8, S8', S9, S9', S12, S12', S16, S16' and the comparator are controlled by the signal with the phase e. For the switches S3, S3', S4, S4', S7, S7', S11, S11', S10, S10', S15, S15' and the flip-flop FF, the triggering takes place with the signal of the phase o. The switching cycles of the switches S6, S5', S13, S14' are defined by the output signal Q1, and the switching cycles of the switches S5, S6', S13', S14 are defined by the inverted output signal QI.

In FIG. 2 of the drawing, an operational amplifier, namely the first operational amplifier OP1 intended as a non-inverting integrator, is wired in a conventional manner, while the wiring of the second operational amplifier OP2, intended as an inverting integrator, is performed in accordance with the invention. The non-inverting and inverting integrators initially only differ from one another in the different triggering of the switches in the input stage. The input stages of the two integrators are provided by the switches S1–S4 and the capacitor C11, and by the switches S9–S12 and the capacitor C21, respectively. The negative feedback stage is typically structured as in FIG. 2, with the switches S19–S22 and the capacitor C12. In the known version, the comparator K must perform the charging of the capacitor C12 with one of the two potentials V1 or V2 during the period of time in which the phase e or the phase o carries the signal H, and in the remaining time must make the decision for the next period of time. In contrast, according to the invention, besides the capacitor C22, an additional capacitor C22' is used in combination with a transposition of the switching configuration (while the number remains the same). This means that the following advantages are attained: The capacitors C22 and C22' are then each charged to one of the two voltages V1, V2, during the entire duration of the signal H of phase e. At the same time, the full duration is also available for the decision of the comparator, which then does not need to be completed until the end of the H signal of phase e. In the ensuing phase o, the second integrator then performs integration with the operational amplifier OP2, as a function of the comparator decision with the capacitor C22 or C22'. As a result, the requirements made of the comparator can be considerably reduced, or with the same comparators the sampling rate can be increased.

Besides the embodiment shown in FIG. 2, a differential embodiment of the sigma-delta moderator is also possible with a symmetrical wiring of the operational amplifiers OP1, OP2, as shown in FIG. 3. To this end, however, according to a feature of the invention, instead of four capacitors, only two capacitors C22 and C22' are then used. Only the switch configuration is modified, as shown in FIG. 3.

The first switch S2, S9 or S9', the second switch S1, S10 or S10', the third switch S4, S11 or S11', and the fourth switch S3, S12 or S12' and the first capacitor C21 or C21' form the input stages of the integrators OP1, OP2. The fifth and sixth switches S13, S14 connect the second capacitor C22 to the first and second nodal points, respectively. Similarly, the seventh and eighth switches S13', S14' connect the third capacitor C22' to the first and second nodal points, respectively. The ninth switch S15 connects the second capacitor C22 to the first potential V1 and the tenth switch S15' connects the third capacitor C22' to the second potential V2. The eleventh switch S16 connects the second capacitor C22 to the second potential V2, while the twelfth switch S16' connects the third capacitor C22' to the first potential V1.

We claim:

1. Switched-capacitor sigma-delta modulator, comprising at least one memory element; at least one comparator connected to said at least one memory element; at least one integrator being connected to said at least one comparator; said at least one integrator having an input stage including a series circuit of a first switch, a first capacitor having two terminals and a second switch, a third switch for connecting one of the two terminals of said first capacitor to ground potential, and a fourth switch for connecting the other of the two terminals of said first capacitor to ground potential; a nodal point connected between said second and fourth switches and the other of the two terminals of said first capacitor; a negative feedback stage including second and third capacitors each having one terminal connected to said nodal point and each having another terminal, a fifth switch for connecting the other terminal of said second capacitor to a first potential, a sixth switch for connecting the other terminal of said third capacitor to a second potential, seventh and eighth series-connected switches for connecting the other terminal of said second capacitor to the second potential, and ninth and tenth series-connected switches for connecting the other terminal of said third capacitor to the first potential.

2. Sigma-delta modulator according to claim 1, wherein said first and second switches have switching phases opposed to said third and fourth switches, said fifth and sixth switches are triggered in phase, said seventh and ninth switches are switched in phase opposition to said first switch, and said eighth and tenth switches are triggered by the output signal of said memory element.

3. Switched-capacitor sigma-delta modulator, comprising at least one memory element supplying an output signal; at least one comparator connected to said at least one memory element; at least one integrator having differential inputs, being symmetrically wired and being connected to said at least one comparator; said at least one integrator having two input stages each including a series circuit of a first switch, a first capacitor with two terminals and a second switch, a third switch for connecting one of the two terminals of said first capacitor to ground potential, and a fourth switch for connecting the other of the two terminals of said first capacitor to ground potential; a first nodal point connected between said second and fourth switches and the other of the two terminals of said first capacitor of said first input stage, a second nodal point symmetrical to said first nodal point being connected between said second and fourth switches and the other of the two terminals of said first capacitor of said second input stage; a first negative feedback stage having a second capacitor with two terminals, a second negative feedback stage having a third capacitor with two terminals; a fifth switch for connecting one terminal of said second capacitor to said first nodal point, a sixth switch for connecting the one terminal of said second capacitor to said second nodal point, a seventh switch for connecting one terminal of said third capacitor to said first nodal point, an eighth switch for connecting the one terminal of said third capacitor to said second nodal point, each of said fifth, sixth, seventh and eighth switches operating as a function of the output signal of said memory element, a ninth switch for connecting the other terminal of said second capacitor to a first potential, a tenth switch for connecting the other terminal of said third capacitor to a second potential, an eleventh switch for connecting the other terminal of said second capacitor to the second potential, and a twelfth switch for connecting the other terminal of said third capacitor to the first potential.

4. Sigma-delta modulator according to claim 2, wherein said first and second switches have switching phases opposed to said third and fourth switches, said ninth and tenth switches are triggered in phase, said eleventh and twelfth switches are switched in phase opposition to said first switch, and said fifth, sixth, seventh and eighth switches are triggered by the output signal of said memory element.

* * * * *